(12) United States Patent
Biggs et al.

(10) Patent No.: US 6,241,868 B1
(45) Date of Patent: Jun. 5, 2001

(54) METHOD FOR ELECTROPLATING A FILM ONTO A SUBSTRATE

(75) Inventors: Glen N. Biggs; Donald M. Brewer, both of Wappingers Falls; James E. Fluegel, Tivoli; Suryanarayana Kaja, Hopewell Junction; Ashwani K. Malhotra, Newburgh; Phillip W. Palmatier, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/541,018

(22) Filed: Mar. 31, 2000

Related U.S. Application Data

(62) Division of application No. 09/181,129, filed on Oct. 28, 1998, now Pat. No. 6,077,405.

(51) Int. Cl.$^7$ .................................................. C25D 5/02
(52) U.S. Cl. ................................................................ 205/118
(58) Field of Search .................................................. 205/118

(56) References Cited

U.S. PATENT DOCUMENTS

| | | |
|---|---|---|
| 5,516,416 | 5/1996 | Canaperi et al. ........................ 205/125 |
| 5,935,404 | 8/1999 | Farooq et al. ........................... 205/125 |
| 6,117,299 * | 9/2000 | Rinne et al. ............................. 205/125 |
| 6,139,712 * | 10/2000 | Patton et al. ............................ 205/143 |

* cited by examiner

Primary Examiner—Kathryn Gorgos
Assistant Examiner—Erica Smith-Hicks
(74) Attorney, Agent, or Firm—Ratner & Prestia; Ira D. Blecker, Esquire

(57) ABSTRACT

A method for electroplating a film onto a substrate. Electrical power is supplied to the plating surface through electrical contact made to contact pads on the underside of the substrate. Contact to the contact pads is made within a liquid-tight region. The contact pads are connected to the plating surface through the substrate. Because the contact scheme is provided within a liquid-tight region on the underside of the substrate, the contacts do not erode or become plated, nor do they consume an area of the plating surface.

14 Claims, 4 Drawing Sheets

METHOD FOR ELECTROPLATING A FILM ONTO A SUBSTRATE

This application is a divisional of U.S. patent application Ser. No. 09/181,129, filed on Oct. 28, 1998, now U.S. Pat. No. 6,077,405.

TECHNICAL FIELD

The present invention relates to the method and apparatus for electroplating a film onto a substrate. More specifically, the present invention provides for an improved method for electrical contact between the substrate and electrical power supply.

BACKGROUND OF THE INVENTION

Electroplating is extensively used in the electronic industry to metallize ceramic and organic substrates. The metallization required for various applications depends upon the required functionality of the substrates. There are several methods of metallization processes such as evaporation, sputtering, thermal spraying, electrodeposition, and electroless deposition. Of these different processes, electrodeposition is one of the most commonly used techniques due to its simplicity and scalability to substrates of various size. Additional advantages such as low cost of operation make electrodeposition a preferred method for metallizing a substrate.

In the electroplating process, electrical contact to the work piece is made through various mechanisms depending upon the size of the work piece and the criticality of the contact area. For example, the electrical contact may be made through a metallic drum formed of metallic mesh in which small pieces are tumbled during plating. This contact method works well if the parts are very small and if micro-scratches on the surface of the deposited metal do not create a problem. Electrical contact may also be provided through a temporary frame attached to the work piece. This method is preferred when there is ample space on the plating surface which is not being plated. This is true when there is a wide edge on the part that is not critical. In some cases, the electrical connections are made by soldering wires to the work piece. All of these methods require, however, that a large area on the surface of the parts is available to provide a contact surface. This large area must either be not functionally critical or not sensitive to micro-damage on the surface.

A current procedure available in the art for making electrical contact to the work piece or substrate during electroplating of high-density electronic packages is by using very small pins making a point contact to the seed layer. The electrical connection to the work piece is made by a point contact to the seed layer on the top surface of the substrate. The point contact is incorporated into an auxiliary electrode but electrically isolated from the electrode. The point contact is connected to the power supply by conducting wires. The work piece and the auxiliary electrode are supported by a polymer block. The auxiliary electrode is held in place by mechanical snap-in locks and the work piece is held in place by vacuum. The complete assembly is immersed in electroplating solution and current is applied to both the work piece and the auxiliary electrode to accomplish metallization of the substrate.

The procedures now available for making electrical contact during electroplating have several limitations and raise concerns in the manufacturing environment. These limitations and concerns include:

(1) The contact area on the top surface of the substrate required by conventional processes is in very short supply: it is consumed at the expense of surface area required for functionality. The contact area becomes functionally unusable. It is preferable to have no electrical contacts on the top surface so that all the surface area can be used for functionality (to satisfy package requirements).

(2) The ends of the point contacts or pins also become coated during the electroplating process and, hence, create variability in the area of the surface being electroplated. This variability, in turn, creates variability in the thickness of the deposited metal (for a given amount of electricity passed). The thickness and uniformity of the plated conductor metal film are extremely important to the electrical functionality of the package.

(3) The insulating coating on the point contacts or pins can become eroded during the plating processes now used. This erosion results in shorts between the substrate or work piece and the auxiliary electrode. These shorts can produce a non-uniform thickness of the metal conductors across the substrate or work piece as well as non-optimal microstructure of the deposited metal (powdery metal compared to dense metal film). Consequently, the point contacts require considerable maintenance in the manufacturing environment to ensure that they do not erode.

(4) The insulation on the electrical wires which connect the pins to the power supply may also become eroded. Once the insulation has eroded, wires which are exposed to the plating solution are also subject to being plated. The plated wires can cause shorts with the auxiliary electrode creating the associated shorting problems as described above.

(5) Loss of contact to the seed layer can occur because of the manner in which mechanical contact is provided between the substrate and the current source (the electrical power supply). Poor or intermittent contact causes incomplete plating which requires the substrates to be scrapped. Scrapped substrates represent a yield loss.

(6) With the top side point contact scheme, a thicker seed layer film is required as substrates get larger in size. As the seed layer increases in thickness, it becomes increasingly more difficult to define and to isolate the conductor features from one another.

(7) Contact areas tend to plate thicker than the remainder of the conductor metal. This irregular thickness in contact areas can create problems during subsequent processing of the substrates, such as coating the substrate with another film such as polyimide.

What is needed is an improved method and apparatus for providing electrical contact to a substrate or work piece which is being electroplated. A method and apparatus are needed that avoid the shortcomings described above. A method and apparatus for electroplating a film uniformly onto a surface, and for providing a contact scheme which does not include the above shortcomings, are especially needed.

SUMMARY OF THE INVENTION

To meet these and other needs, and in view of its purposes, the present invention addresses the shortcomings of the conventional methods available in the art for electroplating a film onto a substrate. The present invention provides a method for forming an electroplating film on a substrate whereby electrical contact is provided between a contact plate and contact pads on the underside of the substrate, wherein both the contact plate and the contact pads are isolated from the electroplating solution. No surface area of the plating surface must be sacrificed to provide the electrical connection, no insulating wires are eroded during the process, and no build-up of electroplated film occurs at undesired locations.

The present invention provides a method for electroplating a film onto a substrate using an apparatus having a top side including a plating surface, an underside, and a peripheral edge. The apparatus includes a substrate holder which contains an electrical contact plate and forms a liquid-tight seal between the contact plate and the underside of the substrate. The apparatus also includes at least one electrode around the peripheral edge of the plating surface. The electrode, which is controlled at a bias different from that of the conductive plate, assists in providing a uniform film distribution on the plated surface.

The present invention also includes structure for providing electrical power to the contact plate of the substrate holder, and the substrate to be plated, by physically and electrically contacting the contact plate to contact pads on the underside of the substrate, which are electrically connected to seeds on the plating surface of the substrate. The present invention also includes an anode to provide a current in the electroplating solution, and separate power supplies: one for supplying electrical power to the contact plate and one for supplying electrical power to the electrode and the cathode.

The present invention provides a method for carrying out the plating process. More specifically, the present invention provides a method for uniformly electroplating a film onto a substrate. The method includes the steps of providing a substrate with a top surface for plating which includes a number of plating seeds, and an underside from which a number of contact pads extend downward. The contact pads are electrically connected through the substrate to the plating seeds on the top side of the substrate. The substrate is releasably retained by the substrate holder wherein the underside of the substrate is secured to the contact plate such that the contact pads extending downward from the underside of the substrate contact the contact plate.

A liquid-tight region is formed between the underside of the substrate and the contact plate so that the contact plate and the contact pads are isolated from the electroplating solution. Therefore, the electroplating solution neither contacts nor deposits a film onto the electrical contact system. The present invention further provides for contacting the plating surface of the substrate with the electroplating solution. Electrical power is supplied to the contact plate which is in contact with the contact pads. An anode is provided within the electroplating solution to provide a current in the electroplating solution which effectuates the electroplating of a film from the electroplating solution onto the substrate surface.

The method of the present invention is particularly attractive because electrical connection is provided to the substrate by a system which is located on the underside of the substrate. This location allows the entire plating surface to be plated as needed. Because the contact area is not on top of the substrate, the contact area does not come at the expense of the plating surface. A further distinctive advantage of the present invention also lies in the connection between the contact pads underneath the substrate and the contact plate. The area between the substrate and the contact plate is sealed in a vacuum. This sealing feature isolates the electrical contact from the plating solution and prevents any plating film from forming on the electrical contacts. This advantage eliminates, in turn, several problems associated with building up an electroplating film on the contact plates and the degradation of the wiring and the associated components which are needed to provide electrical connection.

The present invention also utilizes an electric potential gradient created along the plating surface by holding an electrode at a different bias than the plating surface. This advantage provides for the uniform deposition of the electroplated film.

It is to be understood that both the foregoing general description and the following detailed description are exemplary, but not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary the dimensions of the various features are arbitrarily expanded or reduced for clarity. Included in the drawing are the following figures.

DETAILED DESCRIPTION OF THE INVENTION

Figure 1:
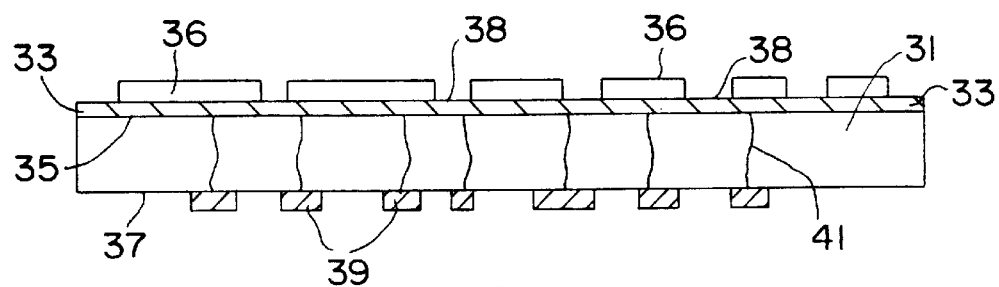
FIG. 1 is a cross-sectional view of a substrate to be plated.

The apparatus and method of the present invention can be best described in conjunction with the drawing. The present invention provides an apparatus and a method for providing a superior electrical contact scheme to a substrate which is being electroplated, and also an apparatus and method for electroplating a substrate. Briefly and in summary, the present invention offers the following advantages.

1. There are no contact areas on the top surface of the work piece; hence, all of the surface area on the top surface can be used for functional features.
2. There are no contact pins so maintenance is reduced.
3. The contact pad is isolated from the plating solution; therefore, the contact area does not become plated. This reduces the variation in the plated metal thickness.
4. Electrical current is distributed evenly to the seed layer through internal features of the substrate. This allows for substrates of different sizes to be plated with the same seed layer thickness.
5. There are no irregularly shaped contact areas which get plated to a very high thickness. This provides for a uniform plated film thickness and also allows for a subsequently applied film, such as a dielectric material, to be of uniform thickness.
6. During the plating process, there is no loss of electrical contact to the substrate due to erosion of contact features.

Now turning to the drawing, FIG. 1 shows a substrate or work piece to be used in the present invention as the plating substrate. Substrate 31 includes a top, plating surface 35 and an underside 37. A plating seed film 33 is disposed on the plating surface 35. The plating seed film 33 is a metal film in the preferred embodiment. The plating seed film 33 may be applied to the substrate 31 by any method common to the art. The plating seed film 33 will provide the individual plating seeds. Plating seeds 38 are formed by applying and patterning a masking film 36 which blocks portions of the plating seed film 33 from the electroplating solution (not shown).

In the preferred embodiment the masking film 36 may be a photoresist film coated onto the substrate and patterned using a photolithographic procedure common to the art. After the photoresist film 36 is patterned, the regions of the electroplating seed film 33 which are not blocked from the electroplating solution, covered by masking film 36, become electroplating seeds 38. When the electroplating process takes place, the electroplated film will preferentially deposit onto the area provided by the electroplating seeds 38.

The substrate 31 also includes a plurality of contact pads 39 which are on the underside 37 of the substrate 31. Electrical connection is provided from the electroplating seed film 33 to the contact pads 39 by a plurality of conductors 41 which extend through the substrate 31. When electrical power is supplied to the substrate by connection to the contact pads 39, the plating seed film 33 will be at the same bias as the contact pads 39. In this manner, the contact seeds 38, similarly biased, serve as electroplating seeds and allow a film to be deposited onto them by electroplating at these points.

Figure 2:
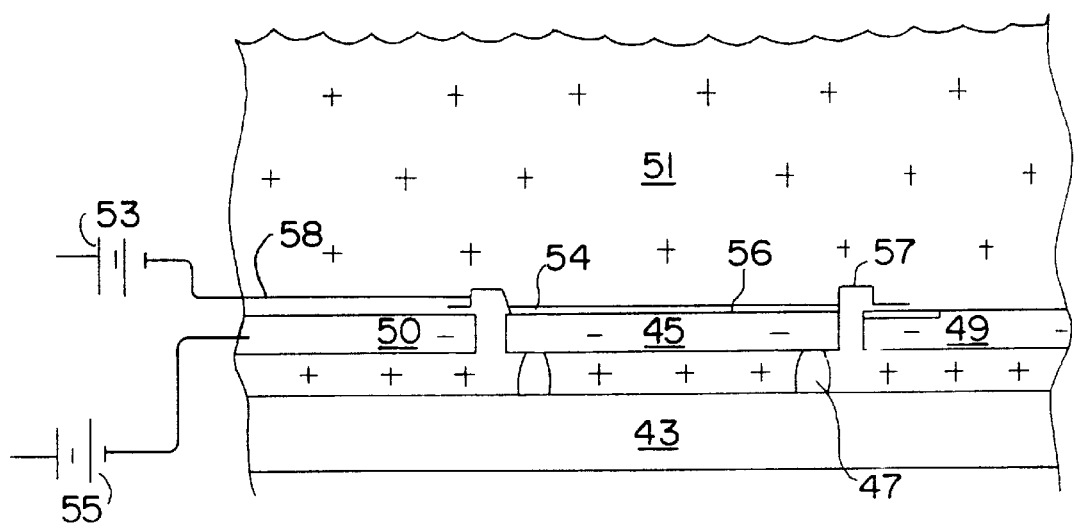
FIG. 2 is a cross-sectional representation of a conventional electroplating apparatus.

FIG. 2 shows a typical contact scheme for making electrical connections to a substrate during electroplating. The electrical connection to the substrate 45 is made by a point contact 57 to the seed layer 54 which is on the top surface 56 of the substrate 45. The point contacts 57 are connected to the power supply 53 by electrical wires 58. A polymer block 43 supports both electrodes 49 and 50 and also supports substrate 45 by means of pins 47. All of the electrical contacts are shown to be immersed within the electroplating solution 51. The electrical connecting wires 58 are also typically immersed within the electroplating solution 51.

As shown, the electrical contact to the substrate 45 comes at the expense of area on the plating surface 56. The electrical contacts will also become electroplated during the electroplating process as they are at the same electrical potential as the surface to be plated within the electroplating solution 51. Thus, a build-up of electroplated film will occur on the contacts. This build-up can create problems in maintaining contact and can result in variations of the electroplated film. Also, at the points where the electrical wires 58 are immersed within the electroplating solution 51, erosion can occur, causing the insulating coating of the wires to be degraded or lost. Once the insulating feature of the wires is lost, shorts may occur: an electroplating film will also form on the exposed electrical wires. As will be seen, the present invention offers many advantages over the conventional contact scheme.

Figure 3:
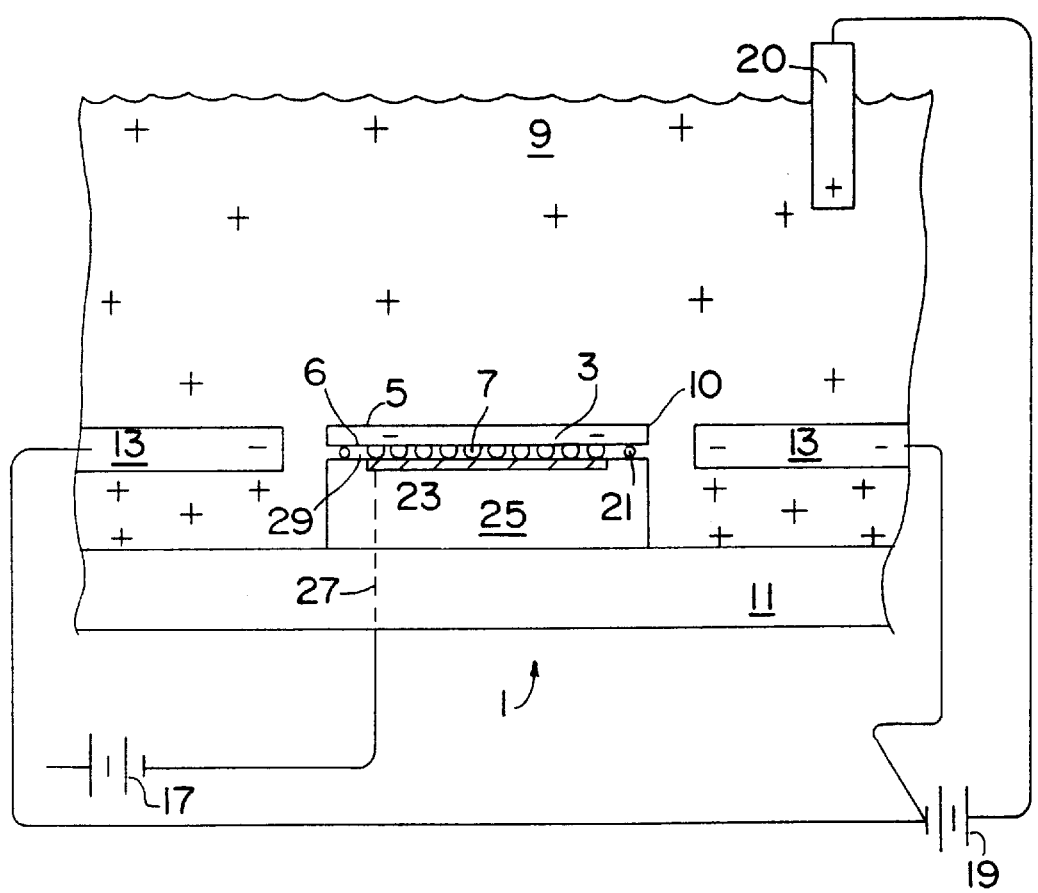
FIG. 3 is a cross-sectional representation of the electroplating apparatus of the present invention.

FIG. 3 shows a cross-section of an exemplary embodiment of the apparatus of the present invention. The plating apparatus 1 includes a polymer support paddle 11 which supports a contact plate 23 by a contact plate support 25. A substrate 3 includes a top, plating surface 5 and an underside 6. Substrate 3 also includes a peripheral edge 10 (the substrate is shown in greater detail in FIG. 1). Disposed around the peripheral edge 10 is an electrode 13. Electrode 13 is shown as two portions which may form parts of a continuous electrode which extends completely around the periphery of substrate 3 to be plated, as in the preferred embodiment. This arrangement will be shown in FIG. 4. In an alternate embodiment, more than one electrode may be used around the periphery of the substrate.

When the contact pads 7 of the substrate 3 are in contact with the contact plate 23, the electrode 13 will be essentially parallel with the top plating surface 5 of the substrate 3. Both the electrode 13 and the plating surface 5 serve as cathodes. Both are negatively charged. The electrode and the plating surface are connected, however, to different electrical power supplies. As can be seen, electrical power supply 17 provides power to the plating surface 5. Meanwhile, electrical power supply 19 provides power to the electrode 13. In this manner, both the plating surface 5 and the electrode 13 can serve as cathodes which are negatively charged but can be maintained at different electrical potentials. The difference in the electrical potential creates an electric potential gradient across the surface of the plating surface 5, which in turn can control the uniformity of the electroplated film which tends to electroplate thicker at the edges of the substrate 3. This phenomenon will be seen in greater detail in FIG. 5.

An anode member 20 is disposed within the electroplating solution 9 and is also connected to the positive side of the power supply 19 which also provides power to the electrode 13. The electrode 13 and the plating surface 5 are in contact with the electroplating solution 9. The electrical contact made by the contact pads 7 contacting the contact plate 23 is made completely within a liquid-tight region 29. The liquid-tight region 29 may be achieved by vacuum sealing the underside 6 of the substrate 3 to the contact plate 23 or the contact plate holder 25 which extends peripherally around the contact plate 23. A rubber gasket 21 may be used to seal the surfaces and provide a liquid-tight region.

In an alternate exemplary embodiment, the liquid-tight seal, between the underside 6 and the contact plate 23 or contact plate holder 25, may be formed by mechanically coupling the substrate 3 to the contact plate holder 25, or may be formed by a spring-loading mechanism sealing the surfaces. In another alternate embodiment, a spring-loading mechanism(not shown) may also be provided to resiliently urge the contact plate 23 up against the contact pad 7 of the substrate 3 to be plated to assist in assuring good contact. The power supplied to the contact plate 23 is provided by electrical power supply 17 which is connected to contact plate 23 by at least one electrical wire 27. The electrical wire 27 extends through the polymer support paddle 11 to make contact to the contact plate 23, which physically and electrically contacts contact pads 7 which, in turn, are electrically connected to the plating seeds (feature 38 in FIG. 1).

During the electroplating process, power is supplied to the anode member 20 and also the electrode 13. Power is also supplied by a separate power supply 17 to the plating surface 5 by contact between the contact plate 23 and the contact pads 7. FIG. 1 shows the substrate to be electroplated in greater detail, and shows the electrical connection between the contact pads (feature 7 in FIG. 3) and the plating seeds (feature 38 in FIG. 1) of the plating surface 5. The electroplating process takes place when current is applied to both the substrate 3, the electrode 13, and the anode member 20. Positively charged ions from the electroplating solution 9 become deposited on the negatively charged contact seeds of the plating surface 5 which functions as a cathode. During this electroplating process, and while the apparatus is emerged in the electroplating solution 9, it can be seen that the contact area (contact pads 7 and contact plate 23) are isolated from the electroplating solution 9.

Figure 4:
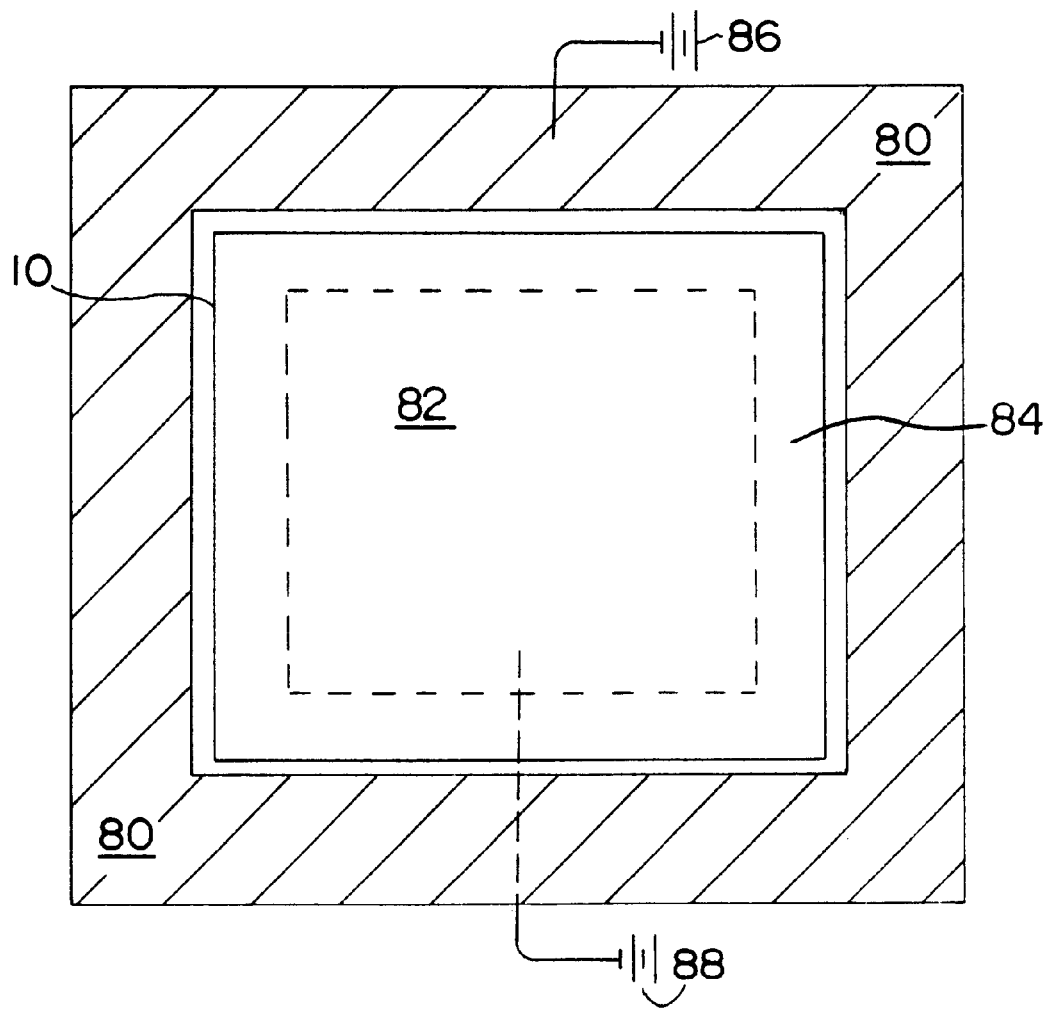
FIG. 4 is a top view of the electroplating apparatus of the present invention.

FIG. 4 shows a preferred embodiment of the electrode configuration. In FIG. 4, substrate 84, which includes peripheral edge 10, is completely surrounded by one electrode 80. The electrode 80 is powered by power supply 86. On the underside of the substrate 84 is contact plate 82. Contact plate 82 is powered by a separate power supply 88. In this manner, the electrical potential of the electrode 80 and the plating surface of the substrate 84 can be maintained at different levels, which can minimize edge effects around the peripheral edge of the entire substrate 84 and provide for a uniform film to be deposited throughout the substrate.

Figure 5A:
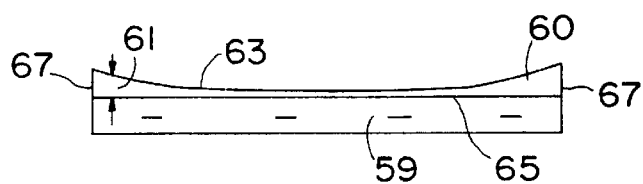
FIG. 5A is a cross-sectional representation showing a non-uniform electroplated film formed on a substrate.

Now turning to FIG. 5A, the effect of a potential gradient, created by maintaining the peripheral electrode at a different potential, can be seen. Without an electrode disposed around the peripheral edge, FIG. 5A shows a plating film 60 which is unevenly deposited onto plating surface 65 substrate 59. Plating film 60 includes top surface 63. It can be seen that the thickness 61 of the plating film 60 is greater toward the edge regions 67 of the substrate. This phenomenon is due to edge effects associated with the electroplating process: a greater volume of electroplating solution is available at the edges to serve as a source of electroplated film.

Figure 5B:
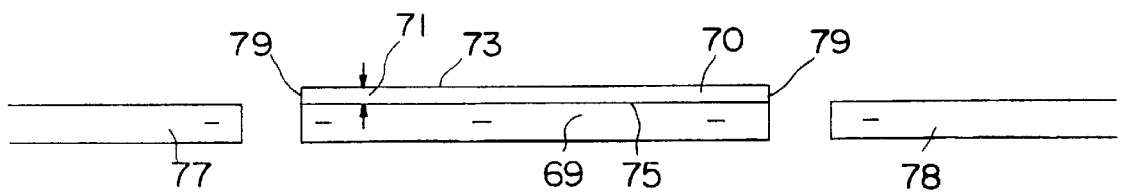
FIG. 5B is a cross-sectional representation showing a uniform electroplated film formed on a substrate.

FIG. 5B shows the effect of a potential gradient which is created by electrode members 77 and 78 which are held at a different electrical potential than the substrate 69 to be electroplated. In the preferred embodiment, electrode members 77 and 78 may represent different sections of one electrode. By using a peripheral electrode which is negatively biased as is the plating surface, but which is maintained at a different potential, a potential gradient may be created along the substrate surface. This potential gradient enables the electroplated film 70 to be of uniform thickness 71 throughout the top plating surface 75 of substrate 69. It can be seen that the thickness at the edges 79 is not greater than the thickness on other regions of the substrate 69.

It should be understood that the foregoing description of exemplary embodiments is presented for the purpose of illustrating and describing the main points and concepts of the present invention. The present invention is not limited, however, to these embodiments. For example, alternate embodiments may use different methods for providing a liquid-tight seal between the underside of the substrate to be electroplated and the contact plate or contact plate holder. Alternate structure may also be used to assure good contact between the contact plate and the contact pads on the underside of the substrate, within the liquid-tight seal formed.

The physical configuration of the apparatus may also be varied while keeping within the scope and spirit of the present invention. For example, the apparatus may be suited to accommodate a substrate of any configuration. The shape of the electrode extending around the peripheral edge of the substrate corresponds to the shape of the substrate being electroplated and, therefore, may assume a variety of shapes. The peripherally extending electrode may also consist of more than one electrode, which may be separately connected to distinct power supplies. This arrangement would depend on the configuration of the plating surface on the substrate. Additional variations of the features which comprise the present invention may also be made without departing from the scope and spirit of the present invention.

What is claimed:

1. A method for electroplating a film onto a substrate comprising the steps of:

a) providing a substrate with a top side including a plating surface having a plurality of plating seeds, an underside having a plurality of contact pads, and a peripheral edge, wherein said plating seeds are electrically connected to said plurality of contact pads;

b) releasably securing said underside of said substrate at least indirectly to a contact plate surrounded by a contact plate holder, said contact pads of said underside releasably contacting said contact plate, and said underside and said contact plate holder forming a liquid-tight seal;

c) contacting said plating surface of said substrate with an electroplating solution, wherein said contact pads of said underside of said substrate and said contact plate are isolated from said solution; and d) applying an electrical current to said contact plate.

2. The method as in claim 1 further comprising the step of creating a potential gradient along the plating surface.

3. The method as in claim 2 wherein the step of creating a potential gradient comprises:

disposing at least one electrode around said peripheral edge, said at least one electrode at a different level of electric potential than said contact plate, and substantially coplanar with said plating surface; and providing electrical current to said at least one electrode wherein said contact plate and said at least one electrode both function as negatively charged cathode members.

4. The method as in claim 3 further comprising the step of forming a current within the electroplating solution by providing an anode member contacting said electroplating solution.

5. The method as in claim 1, wherein said plurality of contact pads comprise metal contact pads.

6. The method as in claim 1, wherein said plurality of plating seeds comprise metal plating seeds.

7. The method as in claim 1, wherein said plurality of plating seeds are formed of a plating film disposed on said top side of said substrate, and wherein said plating film is electrically connected to said plurality of contact pads by a plurality of conductors extending through said substrate.

8. The method as in claim 1 wherein said step b) comprises mechanically securing.

9. The method as in claim 1, wherein said step b) comprises mechanically securing using spring-loaded securing means.

10. The method as in claim 1, wherein said step b) comprises vacuum sealing.

11. The method as in claim 8 wherein said step b) further comprises disposing a rubber gasket between said underside and said contact plate holder.

12. The method as in claim 10 wherein said step b) further comprises disposing a rubber gasket between said underside and said contact plate holder.

13. The method as in claim 1 further comprising resiliently urging said contact plate into contacting with said plurality of contact pads during said step securing.

14. The method as in claim 13, wherein said step for resiliently urging said contact plate into contacting with said plurality of contact pads comprises spring loading said contact plate.

* * * * *